United States Patent [19]

Walker

[11] 4,415,944

[45] Nov. 15, 1983

[54] ELECTRICAL APPARATUS

[75] Inventor: Robert A. Walker, Loughborough, England

[73] Assignee: The Boots Company PLC, England

[21] Appl. No.: 189,910

[22] Filed: Sep. 23, 1980

Related U.S. Application Data

[63] Continuation of Ser. No. 917,411, Jun. 21, 1978, abandoned.

[30] Foreign Application Priority Data

Jun. 23, 1977 [GB] United Kingdom ............... 26328/77

[51] Int. Cl.³ .............................................. H02H 3/16
[52] U.S. Cl. ....................................... 361/42; 361/49; 324/51; 340/650; 340/652
[58] Field of Search ...................... 361/42, 50, 47, 48, 361/49; 324/51; 340/649, 650, 652

[56] References Cited

U.S. PATENT DOCUMENTS

| | | | |
|---|---|---|---|
| 2,207,202 | 7/1940 | La Deau | 361/42 X |
| 3,426,342 | 2/1969 | De Langis | 361/42 X |
| 3,515,942 | 6/1970 | Gordon | 361/49 |
| 3,766,434 | 10/1973 | Sherman | 361/50 |
| 3,905,373 | 9/1975 | Gonser | 361/42 X |
| 3,965,395 | 6/1976 | Young | 361/42 |
| 4,011,483 | 3/1977 | Meadows | 361/47 |
| 4,110,807 | 8/1978 | Neuhouser | 361/42 |
| 4,122,854 | 10/1978 | Blackett | 361/42 X |

FOREIGN PATENT DOCUMENTS 1462383 1/1977 United Kingdom ................. 361/42

Primary Examiner—Patrick R. Salce
Attorney, Agent, or Firm—Charles W. Helzer

[57] ABSTRACT

An earth proving device which includes a solid state relay employing a light emitting diode and photoconductor pair operating on low current/low voltage. Operation of the solid state relay is followed by operation of electromagnetically-operable switches which control electrical connections of a power supply to an electrically-operated apparatus to allow passage of a higher current therethrough. Thus, the earth proving device protects the apparatus by first providing indications of the state of the circuit and earth connections to the apparatus with a low current/low voltage sensing signal before the application of power level current and voltage thereto.

7 Claims, 2 Drawing Figures

ELECTRICAL APPARATUS

This is a continuation of application Ser. No. 917,411, filed June 21, 1978 now abandoned.

This invention is concerned with improvements in or relating to earth proving circuits whereby the existence of a desired earth connection can be established and positively indicated prior to connection of a power supply to electrically-powered apparatus. This invention has particular application, though not exclusively, in identifying an earth connection to the bowl of a fluidised bed drier or to a tanker cable to which a mains power supply is to be connected to power the fan motor or pump respectively.

In designing an earth proving circuit for such applications it is essential that the circuit should fulfill a number of criteria, namely that (1) voltages and currents used in the circuit should be 'safe' i.e. incapable of generating a spark that might result in combustion;

(2) should a fault occur in the circuit, the circuit should be so designed that the possibility of current or voltage surge to a dangerous level can not occur;

(3) the circuit should have built-in capacity for safely testing the earth connection prior to operation thereof, and preventing operation until any fault discovered in the earth connection has been corrected;

(4) any reset facility or manual control switches must be operable by authorized personnel only; and (5) there must be adequate visual and/or audible indication of the circuit condition.

The present invention provides an earth proving circuit whereby the existence and correct functioning of a desired earth connection can be established and positively indicated with a low current/low voltage sensing signal prior to connection of a power supply to electrically-powered apparatus. The circuit comprises a solid state relay unit capable of being operated by a low current/low voltage power supply (as defined prior to allowing passage of a relatively higher current therethrough after the existence of a properly functioning earth connection for the relay unit is established; inidicator means for indicating the condition of the earth connection of the relay unit; and electromagnetically-operable switch means connected to the indicator means and to the relay unit for controlling the indicator means.

In a circuit as set forth in the preceeding paragraph said switch means may comprise a relay, the coil of which is connected to an input of the relay unit to be energised therewith a contact of which can connect a power source to a first indicator of said indicator means to indicate that a desired earth connection has been made.

Preferably a second contact of said relay can connect the power source to a second indicator of said indicator means to show that a desired earth connection has not been made.

Preferably said relay is connected to a first power unit of said power supply.

Said switch means may further comprise a second relay through contacts of which a power supply can be connected to a second input of the relay unit when said second relay is energised or de-energised.

Preferably said second relay is connected to a second power unit of said power supply.

A third relay may be provided for controlling connection of said power supply to said electrically-powered apparatus, operation of said third relay being governed by operation of a fourth relay.

Preferably operation of said fourth relay is governed by said first relay.

In a further circuit according to the invention said switch means may comprise a first solid state low current/low voltage relay, the coil of which is connected between an output of said relay unit and an earth terminal whereat said earth connection is to be established, a second relay, operation of which is governed by energising of said first relay, the second relay having an armature movable between a first position to complete a circuit to a first indicator of said indicator means and a second position to complete a circuit to a second indicator of said indicator means.

Preferably said switch means further comprises a third relay, operation of which is governed by an energised condition of a fourth relay to complete a circuit to a third indicator of said indicator means.

Preferably said circuit to said third indicator is completed through a fifth relay in its energised condition.

Preferably said circuit to said third indicator includes a normally-closed, sixth, relay.

Said sixth relay preferably controls power supply to said electrically-powered apparatus in response to said third relay being energized.

The term "low current/low voltage supply means" is used herein to indicate means of supplying a current of not more than a few milliamps at a low voltage, so that the solid state low current/low voltage relay unit of a circuit according to the invention should be capable of initiating the switching of a current of several amps while itself being operable by a current of, say, two milliamps.

There now follows a detailed description which is to be read with reference to the accompanying drawings of a circuit according to the invention; it is to be clearly understood that this circuit has been selected for description to illustrate the invention by way of example and not by way of limitation.

Figure 1:
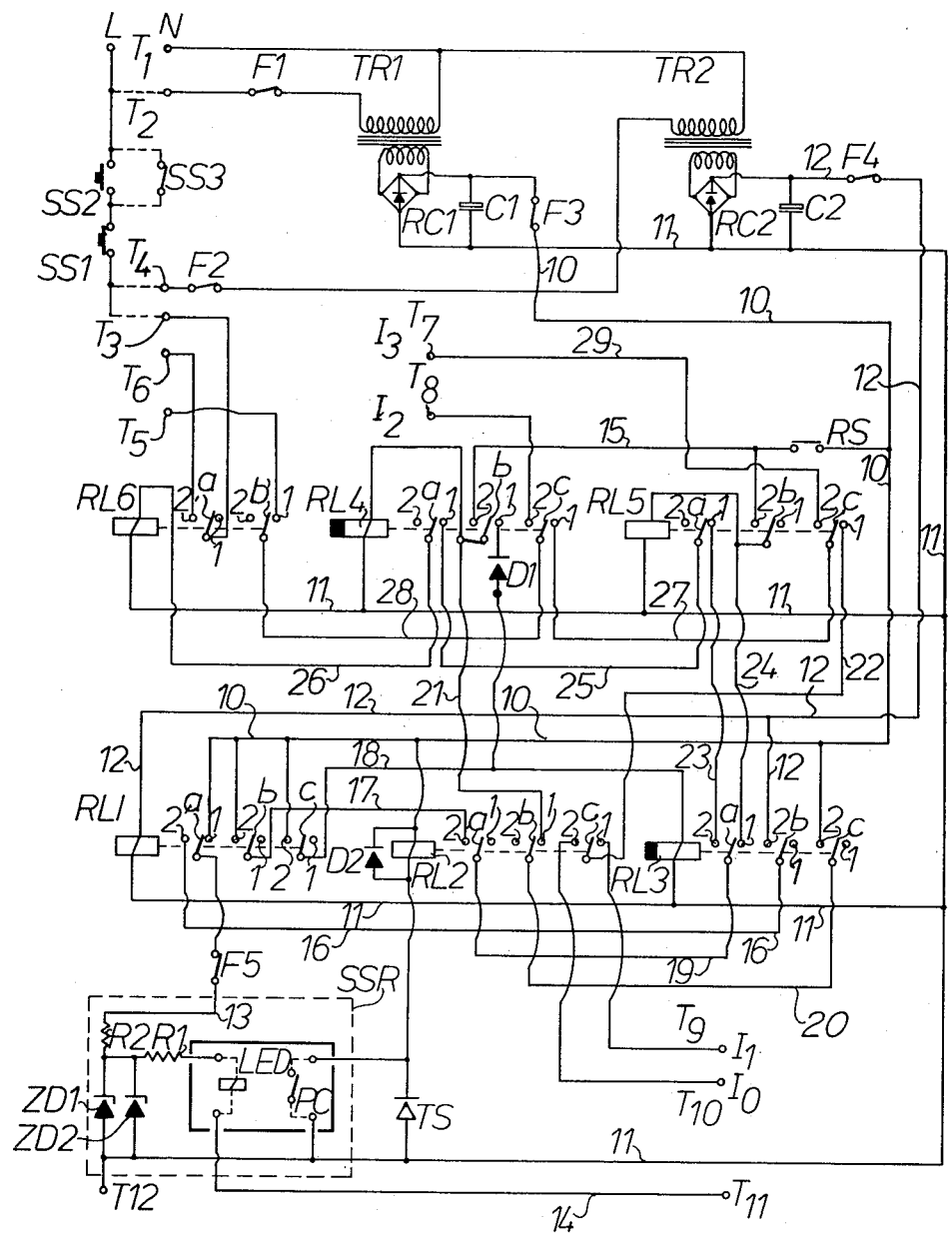
FIG. 1 is a diagram of a circuit according to the invention.

The circuit illustrated in FIG. 1 is suitable for use in confirming an earth connection to a drying bowl of fluidised bed drier prior to the connection of a supply of power level current and voltage to the apparatus.

The circuit comprises input terminals L and N for connection to an A.C. mains supply. The terminal N is connected to one side of the primary coil of each of two step-down transformers TR1 and TR2, each of which provides a 12 volt output from its secondary coil. The other side of the primary coil of the transformer TR1 is connected through a fuse F1 to the mains input terminal L, and the other side of the primary coil of the transformer TR2 is connected through a fuse F2 to the mains input terminal L via a STOP switch SS1 and a START switch SS2 connected in series therewith, the latter switch SS2 being connected in parallel with an auxiliary switch SS3. The arrangement in such that when a mains supply is connected at the terminals L and N, the circuit to the primary coil of the transformer TR1 is complete whereas the circuit to the primary coil of the transformer TR2 is only complete when the switch SS1 is closed and one or other of the switches SS2 and SS3 is also closed.

The secondary coil of the transformer TR1 is connected to a bridge rectifier circuit RC1 providing a full-wave rectified RC output on line 10, the other line 11 from the circuit RC1 being an earth line. A smoothing capacitor C1 is connected across the output of the rectifier between lines 10 and 11. The line 10 includes a fuse F3 and is connected to a fixed, normally-open contact $b_2$ a fixed, normally-open contact $c_2$ and a fixed, normally closed contact $a_1$ of a relay RL1 which has three armatures a, b and c. The line 10 is also connected to the coil of a second relay RL2, to a fixed, normally-open contact $c_2$ of a third, delay, relay RL3 having three armatures a, b, and c, via a reset key RS and line 15 to a fixed, normally-open contact $b_2$ of a fourth, delay, relay RL4 having three armatures a, b and c, and to a fixed, normally-open contact $b_2$ of a fifth relay RL5 having three armatures a, b and c. The line 11 is, as stated above, an earth connection, by which the coil of each of the relays RL1, RL3, RL4 and RL5 and also of a sixth relay RL6 can all be connected to earth.

The secondary coil of the transformer TR2 is connected to a bridge rectifier circuit RC2 providing a full-wave rectified D.C. output on a line 12, the other output of the rectifier being connected to the earth line 11. A smoothing capacitor C2 is connected across the output of the rectifier between the lines 11 and 12. The line 12 includes a fuse F4 and is connected to the unearthed side of the coil of the relay RL1 and to the fixed, normally open contact $b_2$ of the relay RL3.

The second fixed, normally-open, contact $a_2$ associated with the armature a of the relay RL1 is connected to the armature b of the relay RL3 via a line 16. The armature a of relay RL1 is connected via a fuse F5 to an input 13 of a low voltage/low current noninductive solid state relay unit SSR hereinafter described. The armature b of relay RL1 is connected via a line 17 to the fixed, normally open, contact $a_2$ of relay RL2 and the armature c of relay RL1 is connected via a line 18 to the unearthed side of the coil of relay RL3 and via a diode D1 to a normally-closed contact $b_1$ associated with the armature b of the relay RL4.

The coil of the relay RL2 is connected in parallel with a diode D2. The other side of the coil, i.e. that side not connected to the line 10, is connected via a selenium transient suppressor TS to the earth line 11 and to a second input of the solid state low current/low voltage noninductive relay unit SSR.

The armature a of relay RL2 is connected via a line 19 to the armature a of the relay RL3. The armature b of relay RL2 is connected via a line 20 to the armature c of relay RL3. A fixed, normally-closed, contact b, of relay RL2 is connected via a line 21 to the unearthed side of the coil of relay RL4 and to the armature b of relay RL4. The armature c of relay RL2 is connected via a line 22 to a fixed, normally closed, contact $c_1$ of relay RL5, and the associated normally-open contact $c_2$ of relay RL2 is connected to an indicator $I_0$ which is described below. The normally-closed contact $c_1$ of relay RL2 is connected to a second indicator $I_1$ also described below.

The fixed, normally-open contact $a_2$ associated with armature a of relay RL3 is connected via a line 23 to the fixed, normally-closed contact $a_1$ associated with the armature a of relay RL5 while the associated normally closed contact $a_1$ of relay RL3 is connected to the unearthed side of the coil of relay RL5 and to the armature b thereof via a line 24.

The fixed, normally-closed, contact $a_1$ associated with armature a of relay RL4 is connected via a line 25 to the armature a of relay RL5 while the armature a of relay RL4 is connected via a line 26 to the unearthed side of the coil RL6. The fixed, normally-open, contact $c_2$ associated with armature c of relay RL4 is connected to a third indicator $I_2$ described below, while the fixed, normally-closed, contact $c_1$ is connected via a line 27 to the armature c of relay RL5. The armature c of relay RL4 is connected to an armature b of the relay RL6 via a line 28.

The fixed, normally-open, contact $c_2$ of relay RL5 is connected to a fourth indicator $I_3$ described below via a line 29.

The armature a of relay RL6 is connected to the STOP switch SS1 while its fixed, normally-open contact $a_2$ is arranged to be connected via terminal $T_5$ to the contactor coil of the motor of the fan of the fluidised bed drier referred to above. The fixed normally-closed contact $b_1$ of the relay RL6 is arranged to be connected via terminal $t_5$ to a power supply unit for the indicators $I_0$ to $I_3$.

The solid state relay unit SSR comprises a photoelectric cell PC which operates as a solid state switch connected to the coil of the relay RL2 and to the earth line 11. The photoelectric cell PC is positioned to detect light emitted from a light-emitting diode (LED) which is connected to a line 14 for connection via terminal $T_{11}$ to the bowl of the aforesaid drier and in series with a 47Ω resistor R1, the resistor being connected in turn to two parallel-connected Zener diodes ZD1, ZD2 which are earthed via the earth line 11 and are also connected via a 100Ω resistor R2 to the input line 13 of the solid state relay unit SSR.

In a practical form of circuit according to the present invention, the transformers TR1, TR2, relays RL1–RL6, relay unit SSR, suppressor TS, capacitors C1, C2, rectifier circuits RC1, RC2, fuses F1–F5 and diodes D1, D2 are all provided in a composite unit having appropriate connections to the mains and indicator supply, the motor coil, earth, the drier bowl and the indicators $I_o$ to $I_3$. The mains supply is connected to the unit by terminal connectors $T_1$ to $T_4$, the power supply for the indicators by terminal connector $T_5$, the motor coil by terminal connector $T_6$, the indicator $I_3$ by terminal connector $T_7$, the indicator $I_2$ by terminal connector $T_8$ and the indicators $I_1$ and $I_o$ by terminal connectors $T_9$ and $T_{10}$ respectively. The drier bowl is connected to the circuit by terminal connector $T_{11}$ and the circuit can be connected to earth by terminal connector $T_{12}$.

The indicators $I_o$–$I_3$ are preferably electrical indicators (e.g. lamps) although they may alternatively be pneumatic indicators. When electrical indicators are used they should comply with BS 229/1957, 4683/1971 and 4099/1967. The indicator $I_o$ is provided to give an indication that the earth connection of the bowl is positive and that the operation of the drier can commence as described below. The indicator $I_1$ is provided to give an indication that the earth connection is disconnected. The indicator $I_2$ is provided to give an indication that there is a fault on the earth line, and the indicator $I_3$ is provided to give an indication of a fault in the circuit.

Prior to the commencement of operation of the drier and connection to earth at $T_{12,o}$ the mains supply is connected to the illustrated circuit via the terminal connectors $T_1$–$T_4$ with the switches SS2 and SS3 open, and an auxiliary supply is connected to the terminal connector $T_5$. The mains supply is applied via the transformer TR1 and the lines 10 to the coil of relay RL2. The 12 V supply from the transformer TR1 is also applied to the solid state relay unit SSR via contact $a_1$ of relay RL1, fuse F5 and input line 13.

The auxiliary supply at $T_5$ is connected via the closed contact $b_1$ of relay RL6, line 28, the closed contact $c_1$ of relay RL4, line 27, contact $c_1$ of relay RL5, line 22 and contact $c_1$ of relay RL2 with the indicator $I_1$ via the terminal connector $T_9$ thereby illuminating the lamp which indicates that earth has not yet been connected properly. The lamp is illuminated until this condition is removed.

When the connections are made at $T_{12}$ to earth and $T_{11}$ to the drier bowl, respectively, the circuit to the relay unit SSR is completed and the relay unit is energised by completion of the circuit through the input 13, the LED and the line 14 to the drier bowl via terminal $T_{11}$. Energising of the LED in turn causes the photocell PC to operate in the circuit from the coil of the relay RL2 through to the earth line 11. Connection to earth via connector $T_{12}$ completes the circuit through the coil of relay RL2, thus energising the relay to move the armatures from the '1' positions shown to their alternative '2' positions. Thus the armature c moves to contact $c_2$ thereby opening the circuit from the terminal connector $T_5$ to the indicator $I_1$. The lamp of the indicator $I_1$ therefore goes out, whilst the indicator $I_o$ is connected via contact $c_2$ of relay RL2 and its lamp is illuminated to indicate that operation of the drier can safely commence as a result of the indication obtained from the low current/low voltage sensing circuit means comprised by solid state relay SSR. If the earth connection to the drier bowl properly exists, the above described action takes place to turn on indicator $I_o$ and to turn off indication $I_1$. However, if there is no effective earth connection to the drier bowl, indicator $I_1$ remains on and indicator $I_o$ stays off. The sensing voltage involved in testing for the existence of the ground is of the order of 12 volts while the sensing current after passing through resistors R2 and R1 as well as LED is of the order of only a few milliamps. As noted above, such low voltage/low current sensing for the existence of a suitable ground connection cannot uner the conditions described give rise to an explosion. Thus it will be appreciated that the LED and photocell PC comprise a noninductive solid state relay unit SSR having no inductive reactance; input 13, fuse F5, contact $a_1$ of relay RL1, line 10, rectifier RC1, C1 and transformer TR1 comprise means for supplying a low current, low voltage electric signal to the noninductive solid state relay unit SSR and is capable of operating the solid state relay unit in the presence of a good ground connection; the indicators $I_1$ and $I_o$ comprise indicator means for indicating the condition of the earth connection of the noninductive solid state relay unit in response to energization by the low current/low voltage electric signal; and the terminal $T_{12}$ comprises ground connection means for connecting the earth connection of the solid state relay SSR to the ground connection for the electrically powered apparatus to be tested for the existence of a good ground connection for the electrically powered apparatus to be tested for the existence of a good ground connection in advance of the supply of power level voltage and current thereto.

After establishing the existence of a suitable ground connection to the drier bowl in the above manner, starting of the drier is effected by closing the START switch SS2. The effect of closing this switch is to complete the circuit to the transformer TR2. As a result a 12 V rectified D.C. supply is connected via line 12 to the coil of relay RL1, thereby energising the relay, and to contact $b_2$ of relay RL3. Energising of the relay RL1 causes its armatures to move to their alternative '2' positions, thereby breaking the circuit via armature a between the rectifier circuit RC1 and the relay unit SSR; the relay unit SSR is thus de-energised. The indicator $I_o$ however is still operative.

The armature b of relay RL1 having moved to contact $b_2$ is thus connected via line 10 with the 12 V supply from the rectifier circuit RC1 and connects the supply to the armature a of the relay RL2 via its contact $a_2$ and line 17 (relay RL2 being energised by the 12 V supply from the transformer TR1 due to the conduction of photoconductor PC of the solid state relay unit SSR), and thus to the armature a of relay RL3.

The armature c of relay RL1 is similarly connected via line 10 with the 12 V supply from the rectifier circuit RC1 and connects, via line 18, the supply to the coil of the relay RL3 which has a one-second delay time. After the expiration of the one-second delay, the relay RL3 is energised moving the armatures thereof to the '2' position. This has the effect of connecting the 12 V supply from the rectifier circuit RC2 via line 12, contact $b_2$ of relay RL3, line 16 and contact $a_2$ of relay RL1 to the input 13 of the solid state relay unit SSR. If the earth connection is still positive, then the solid state relay unit SSR will operate with the power supply to the LED provided from the transformer TR2.

As stated above, with the power supply from the transformer TR1 connected to the armature a of relay RL3 at this stage, and with relay RL3 energised, the power supply is connected via line 23, contact a, of relay RL5, line 25 and contact $a_1$ of relay RL4 with the coil of relay RL6, which is thus energised, its armatures then moving to their '2' positions. This has the effect of breaking the circuit from the auxiliary supply for the indicators which are connected at terminal connector $T_5$ and of connecting the mains supply via the terminal connector $T_3$, contact $a_2$ of relay RL6 and terminal connector $T_6$ with the contactor coil of the motor of the fan of the drier to drive the motor. By tracing through the above-described circuitry used to interconnect terminal $T_6$ with power supply terminal $T_3$, it will be appreciated that relay RL2, which can be operated via photoconductor PC of the solid state relay unit SSR, in fact forms a first logic circuit means responsive to the output from the solid state relay unit for locking out operation of the electrically powered apparatus unless and until the existence of a suitable ground connection to the apparatus is established.

If a fault develops in the earth connection during operation of the drier, and circuit through the LED of the relay unit SSR will be broken and the photocell PC then ceases to function thereby breaking the circuits of the coil of the relay RL2, and thus de-energising the relay. However, when this happens, the relay RL3 remains energised with its armatures in the '2' positions because the relay RL1 also remains energised with its armatures in the '2' positions. Specifically armature c of RL1 remains on $C_2$ whereby the transformer TR1 is connected to the coil of relay RL3 via line 10, contact $c_2$ of relay RL1 and line 18. With the relay RL2 de-energised its armatures return to their '1' positions so that armature a thereof is dis-connected from the power supply at contact $a_2$ and the circuit therefrom through contact $a_2$ of relay RL3, line 23, contact $a_1$ of relay RL5, line 25, contact $a_1$ of relay RL4 and line 26 to the coil of relay RL6 is broken, thereby de-energising relay RL6 with the effect that armature a thereof moves to its '1' position thereby disconnecting the terminal motor connector $T_6$ from the mains supply on terminal connector $T_3$. The motor connected to terminal connector $T_6$ will then stop. It will be appreciated therefore that the relays RL2 and RL6 together with their associated contacts of other relays and connecting conductors as described in this paragraph comprise second logic circuit means for automatically disconnecting the supply of power level voltage and current to the electrically powered apparatus in the event a ground fault occurs during operation of the apparatus.

With the relay RL2 de-energised there is a second effect which is that the power supply from transformer TR1 is connected via contact $c_2$ of relay RL3, which is still energised, line 20 and contact $b_1$ of relay RL2 with the coil of relay RL4, which has a two-second delay period. During this two-second delay, the armature b of relay RL4 is in its '1' position thereby holding the relay RL3 energised, while the auxiliary supply for the indicators is connected via contact $b_1$ of relay RL6, line 28, contact $c_1$ of relay RL4, line 27, contact $c_1$ of relay RL5, line 22 and contact $c_1$ of relay RL2 with the indicator $I_1$ connected at terminal connector T9 thereby illuminating the lamp thereof to indicate that the earth connection requires checking.

At the expiration of the two second delay, relay RL4 will be energised and its armatures moved to their '2' positions. The effect of this is to lock the coil of relay RL4 to the power supply from the transformer TR1 via contact $b_2$ of the relay, line 15 and the reset switch RS which is in its closed position. The indicator $I_2$, which indicates a fault in the earth connection, is connected to the auxiliary power supply via contact $b_1$ of relay RL6, line 28 and contact $c_2$ of relay RL4, and the lamp of indicator $I_2$ is illuminated, whilst the circuit to the indicator $I_1$ is broken.

With RL4 energised, its armature a is in position '2', thereby preventing relay RL6 from being energised and maintaining an open circuit between terminal connectors $T_3$ and $T_6$. However opening of the reset switch RS breaks the circuit between the transformer and the coil of relay RL4 via contact $b_2$ thereof, thereby de-energising the relay. With relay RL4 de-energized, armature a thereof returns to its '1' position thereby connecting the coil of relay RL6 to the power supply on the armature a of relay RL3 via lines 26 and 25, contact $a_1$ of relay RL5 and line 23. Relay RL6 is thus energised again to complete the circuit across contact $a_2$ between the auxiliary power supply and the motor.

If at any time, an attempt is made to start the motor with a defective earth connection and the start switch SS2 is held closed for more than one second, the relay RL3 will be energised, as a result of the relay RL1 being energised, to connect the power supply to the coil of relay RL3 via contact $c_2$ of relay RL1 and line 18. The power supply to the coil of relay RL3, will then also be supplied via contact $c_2$ of relay RL3, line 20, contact $b_1$ of relay RL2, line 21 and contact $b_1$ of relay RL4. With power also applied from contact $b_1$ of relay RL2 to the coil of relay RL4 via line 21, relay RL4 will be energised after two seconds thereby breaking circuit to the coil of relay RL6 so that the motor will not start, as explained above. Accordingly, it will be seen that relays RL3, RL4 and RL6 acting together with their interconnected circuit conductors as described in this paragraph, function as a fourth logic circuit means for locking-out operation of the electrically powered apparatus by preventing the supply of power level current and voltage thereto in the event of a ground or circuit fault despite continued efforts to operate start switch SS2.

If at any time, the relay unit SSR is faulty, it will be understood that the relay RL2 remains energised even when the power supply from the transformer TR2 is removed. When the start switch SS2 is closed, relay RL1 will be energised as described above, and switchover of the armature a thereof will disconnect the power supply from the transformer TR1 to the relay unit SSR. Power will still be supplied to the coil of relay RL2 via the line 10 thereby energising the relay. With both relays RL1 and RL2 energised, power from the transformer TR1 is supplied via contact $b_2$ of relay RL1, line 17, contact $a_2$ of relay RL2, line 19, contact $a_1$ of relay RL3 and line 24 to the coil of relay RL5 thereby energising this relay. When energised, its armatures specifically armature b, move to their '2' positions with the result that power is supplied to the coil of relay RL5 via armature b. With armature a of relay RL5 in its '2' position, no power can be supplied to relay RL6 so that the motor will not start until the fault in the relay unit SSR has been corrected and the reset switch RS operated. The circuit fault indicator $I_3$ will be activated via contact $c_2$ and contact $c_1$ of relay RL4 and contact $b_1$ of relay RL6. Thus, it will be appreciated that relay RL5 together with its attendant circuit interconnections as described in this paragraph comprises a third logic circuit means for automatically disconnecting the supply of power level voltage and current to the electrically powered apparatus in the event a fault occurs in the solid state relay unit SSR or other portion of the earth proving circuit during operation of the apparatus.

As will be appreciated from the above description, before the motor of the fan of the fluidised bed drier can start, the power supply to the relay unit SSR and to the relay RL2 is interrupted for a period of one second by the delay period of the relay RL3, thus providing the facility for checking operation of the relay unit SSR. Additionally the power supply to the motor is disconnected until earth connection is positive or until a fault in the relay unit SSR is rectified. The motor is also prevented from being re-connected with the mains supply in the event of the fault in the circuit until the fault has been rectified and the reset switch RS has been operated.

A modification of the solid state relay unit is shown in dotted outline in FIG. 1. This modified relay unit is similar to the relay unit of FIG. 1 but incorporates provision for directly earthing the LED by providing a switch at a remote location so that in the event of an earth connection, such as that provided via line 14 and terminal connector $T_{11}$ to, say, the bowl of a fluidised bed drier, not being required, the LED can be earthed to allow the earth proving circuit to operate as described above.

Figure 2:
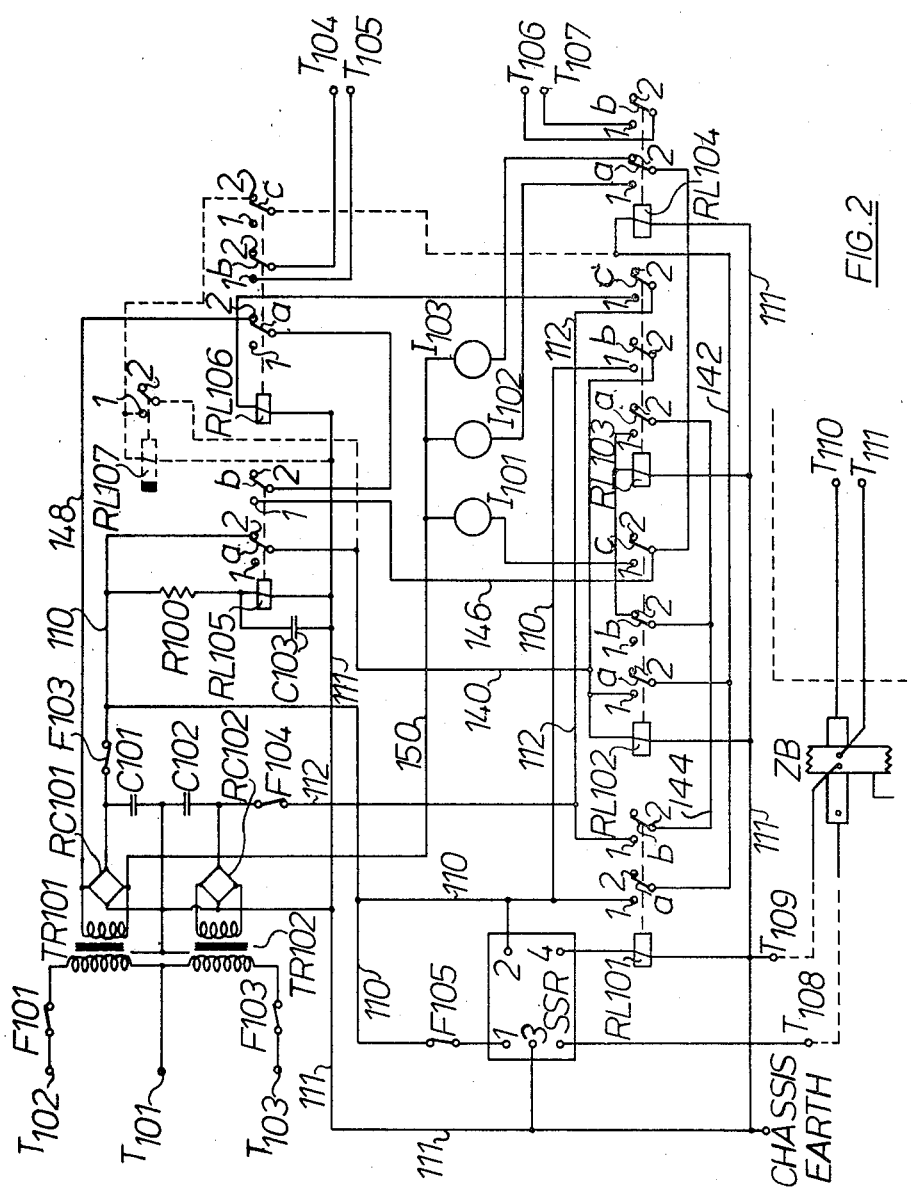
FIG. 2 is a diagram of a second circuit according to the invention.

The earth proving circuit illustrated in FIG. 2 is intended for use in confirming an earth connection of a tanker at a terminal to reduce the possibility of an explosion due to stray voltage when a pump is operating to load or unload combustible liquids. The circuit is designed to prevent the pump from operating in the event that a proper earth connection of e.g., a cable from the tanker is not established and confirmed or in the event that such a connection is broken during a pumping operation.

The circuit comprises input terminal connectors $T_{101}$, $T_{102}$ and $T_{103}$ for connection to an A C mains supply, transformers TR101 and TR102 supplying a full-wave rectified 15 volt D.C. output via bridge rectifier circuits RC101 and RC102 respectively on lines 110 and 112, with a common line 111 providing a chassis earth line, the construction of the rectified outputs of the circuit being similar to that of the circuit shown in FIG. 1. The line 110 includes a fuse F103 and is connected via a normally-closed contact $a_2$ of a relay RL105 having two armatures a and b, and a line 140 with the coil of a relay RL102, a normally-open contact $a_1$ thereof, and a second armature b of a relay RL103, the armature b being in a normally-open position. The line 110 is also connected via a resistor R100 with the coil of the relay RL105, the coil being earthed and connected in parallel with a capacitor C103. The line 110 is further connected to inputs '1' (via a fuse F105) and '2' of a solid state relay SSR, which is substantially similar to that of the circuit of FIG. 1, to a normally-open contact $a_1$ of a relay RL101 and to a normally-open contact $b_1$ of the relay RL103.

The earth line 111 is connected to the coil of each of the six relays R101 to R106 of the circuit and to an earth connection '3' of the solid state relay SSR.

The line 112 is connected, via a fuse F104 with a normally-open contact $b_1$ of the relay RL101 and by armature c with the normally-open contact $c_2$ of the relay RL103.

The coil to relay RL101 is connected to a terminal '4' of the solid state relay SSR. Normally open contact $a_2$ of RL101 is connected, via the armature a and a line 142, with the armature a of relay RL102, and with the coil of relay RL104. The armature b of RL101 is connected, via a line 144, with the normally-closed contact $b_2$ of relay RL102 and with the armature a of relay RL103.

The contact $b_2$ of relay RL102 is connected to the coil of relay RL103 and to the normally-open contact $a_1$ thereof. Normally-open contact $c_1$ of relay RL102 is connected to an indicator $I_{101}$, the purpose of which will be explained below; contact $c_2$ of RL102 is connected to armature a that normally is closed on contact $a_2$ of relay RL104; and armature c of relay RL102 is connected by a line 146 to a normally-open contact $b_1$ of relay RL105.

Normally open contact $c_1$ of relay RL103 is connected to the coil of relay RL106.

Normally open contact $a_1$ of relay RL104 is connected to a second indicator $I_{102}$ and normally closed $a_2$ is connected to a third indicator $I_{103}$. The purpose of these indicators will be explained below. Contact $b_1$ of relay RL104 is connected to a terminal connector $T_{107}$ and the armature b which is normally open is connected to a terminal connector $T_{106}$, the purpose of which will be explained below.

The armature b of relay RL105 which is normally open is connected via the armature a of RL106 to the normally-closed contact $a_2$ of relay RL106.

Contact $a_2$ of relay RL106 is connected via a line 148 with the secondary coil of the transformer TR101 whereby a 12 volt A.C. supply is connected to the contact $a_2$. Contact $b_1$ of relay RL106 is connected to a terminal connector $T_{105}$ and armature b of a terminal connector $T_{104}$.

The indicators $I_{101}$, $I_{102}$ and $I_{103}$ are connected via a line 150 to the secondary coil of the transformer TR101. The indicator $I_{101}$ is connected so that it will be illuminated when the desired earth connections via connectors $T_{108}$ and $T_{109}$ are open and thus no earth connections have been made to the tanker. The indicator $I_{102}$ is connected so as to be illuminated when the desired earth connection has been made and the pump is ready to commence operation. The indicator $I_{103}$ is connected so as to be illuminated when an earth fault exists or before the earth has been disconnected from the tanker after the latter has been filled.

When the circuit is set up for use, the connectors $T_{108}$ and $T_{109}$ are connected to the zener barrier ZB in an intrinsically safe area and the connectors $T_{110}$ and $T_{111}$ are checked to ensure that they are not earthed. The connectors $T_{104}$ and $T_{105}$ are connected in series with the contactor coil of the pump motor and the connectors $T_{106}$ and $T_{107}$ are connected either to a data processing apparatus or to a lamp to provide signals that an earth connection has been made when this is so.

The mains supply to the transformer TR101 is then completed by closing an isolator switch and as a result the relay RL102 operates from the DC supply provided via line 110, contact $a_2$ of relay PL105 and line 140. Without an earth connection established, via terminal connectors $T_{108}$, $T_{109}$, to the relay RL101, this relay will not operate. After a delay of approximately 1 second, relay RL105 will operate, thereby opening the circuit via line 140 and thus de-energising relay RL102. The effect of this is to complete the circuit to the indicator $I_{103}$ from the secondary coil of the transformer TR101 via the line 150 on one side of the indicator and via the line 148, armature a of relay RL106, armature b of relay RL105, line 146, armature c of relay RL102 and armature a of relay RL104, on the other side.

When the earth connections are completed via the connectors $T_{108}$ and $T_{109}$, the solid state relay SSR will be energised, thereby completing the circuit through the coil of the relay RL101. Energising of the relay RL101 causes the DC power supply to be connected via the armature a of relay RL101 to the coil of relay RL104. With the armature a moved from contact $a_2$ to contact $a_1$, the indicator $I_{102}$ is illuminated instead of the indicator $I_{103}$.

The power supply to the pump is then connected via the connectors $T_{101}$ and $T_{103}$. This together with operation of relay RL101 causes the relay RL103 to be energised via contact $b_1$ of relay RL101 and contact $b_2$ of relay RL102 and is thereafter held on through its own contact $a_1$ for so long as RL101 remains energized, Relay RL102 is operated again via line 110 and contact $b_1$ of relay RL103, and is held on via contact $a_1$ of relay RL101. With relay RL103 energised, relay RL106 is energised via line 112 and contact $c_1$ of relay RL103 and the contactor coil circuits to operate the pump are completed via connectors $T_{104}$, $T_{105}$ and contact $b_1$ of relay RL106. The indicator $I_{103}$ is disconnected and $I_{102}$ connected due to the circuit being changed from at contact $a_2$ to $a_1$ of relay RL106.

The pump can be stopped by disconnecting the power supply at the connectors $T_{101}$ and $T_{103}$. This causes the relay RL103, and thus the relay RL106, to be de-energised. The contactor coil circuit via terminal connections $T_{104}$ and $T_{105}$ through the armature b of relay RL106 is thus opened. Relay RL102 remains energised by connection of the power supply via the contact $a_1$ of relay RL101 and contact $a_1$ of relay RL102. With relay RL105 energised the circuit to the indicator $I_{101}$ is completed via contact $a_2$ of relay RL106, contact $b_1$ of relay RL105, line 146 and contact $c_1$ of relay RL102. Relay RL103, and thus relay RL106, can not be energised as armature b of relay RL102 is in the '1' position.

If the earth connections at terminal connectors $T_{108}$, $T_{109}$ are broken, the solid state relay SSR, and thus the relay RL101, are de-energised. This causes relays RL102 and RL104 to be de-energised also. The indicator $I_{103}$ is then illuminated via contact $a_2$ of relay RL104, contact $c_2$ of relay RL102, line 146, contact $b_1$ of relay RL105 (still energised), contact $a_2$ of relay RL106 and line 148. The indicator $I_{101}$ is disconnected at the relay RL102.

Via the contact $b_1$ of relay RL104, two signals can be supplied via connectors $T_{106}$ and $T_{107}$ for the relay RL104 is energised whenever the relay RL101 is energised.

As will be appreciated from the above, the connectors $T_{108}$ and $T_{109}$ must not be connected when the power supply is connected at $T_{101}$ and $T_{102}$. To enable the earth proving circuit to be checked each time the pump is used, it is necessary to reset the circuit by disconnecting the earth from the tanker after the pump has stopped; the pump will stop if the earth becomes disconnected.

In a modified circuit according to the invention, a seventh, delay, relay RL107, having a single armature is introduced, the coil being earthed at one side by the line 111 and being connected to a contact $c_2$ of the relay RL106 and to its own contact '1', the armature of relay RL107 is in its normally open position and is connected to the line 140. In this modified circuit, the armature c of relay RL106 is connected to the coil of the relay RL104.

What we claim is:

1. An earth proving circuit whereby the existence of a desired earth connection for electrically powered apparatus can be established and positively indicated prior to the supply of power level voltage and current from a power supply connectable to the electrically-powered apparatus, the circuit comprising a non-inductive solid state relay unit having no inductive reactance and capable of allowing passage of only a low current of the order of a few milliamperes therethrough at a low voltage of the order of 12 volts under conditions where an earth connection for the non-inductive solid state relay unit is established, circuit means for supplying a low current/low voltage electric signal to said non-inductive solid state relay unit and capable of operating said solid state relay unit in the presence of a good ground connection, indicator means for indicating the condition of the earth connection to the non-inductive solid state relay unit in response to energization by said low current/low voltage electric signal, ground connection means for connecting the earth connection of said non-inductive solid state relay unit to the ground connection for the electrically powered apparatus to be tested for the existence of a good ground connection in advance of the supply of power level voltage and current thereto, and fourth logic circuit means for locking-out operation of said electrically powered apparatus by preventing the supply of power level current and voltage thereto in the event of a ground or circuit fault during operation of the apparatus and continued operation of a manually operable start switch means, and manually operable reset switch means for resetting said fourth logic circuit means to allow supply of power level current and voltage to the apparatus operable only after correction of the fault and re-establishment and proof of the existence of a suitable ground connection for the electrically powered apparatus.

2. An earth proving circuit according to claim 1 further including first logic circuit means responsive to the output from said solid state relay unit for locking-out operation of said electrically powered apparatus by preventing the supply of power level current and voltage thereto unless and until the existence of a suitable ground connection to the apparatus is established.

3. An earth proving circuit according to claim 2 further including second logic circuit means for automatically disconnecting the supply of power level voltage and current to the electrically powered apparatus in the event a ground fault occurs during the operation of the electrically powered apparatus, and wherein said indicator means includes a first indicator for indicating that the earth connection to said electrically powered apparatus is good and a second indicator for indicating that the earth connection to the electrically powered apparatus is bad and in the event of a ground fault during operation of the electrically powered apparatus said second logic circuit means automatically turns off said first indicator and turns on said second indicator.

4. An earth proving circuit according to claim 1 further including logic circuit means for automatically disconnecting the supply of power level voltage and current to the electrically powered apparatus in the event a ground fault occurs during the operation of the electrically powered apparatus, and wherein said indicator means includes a first indicator for indicating that the earth connection to said electrically powered apparatus is good and a second indicator for indicating that the earth connection to the electrically powered apparatus is bad and in the event of a ground fault during operation of the electrically powered apparatus said logic circuit means automatically turns off said first indicator and turns on said second indicator.

5. An earth proving circuit according to claim 1, 2 or 4 further including third logic circuit means for automatically disconnecting the supply of power level voltage and current to the electrically powered apparatus in the event a fault occurs in the solid state relay unit or other portion of the earth proving circuit during operation of the apparatus and wherein said indicator means includes a circuit fault indicator for indicating the occurrence of a fault in the solid state relay unit or other portion of the earth proving circuit and said third logic circuit means automatically turns on said circuit fault indicator in the event a fault occurs in the solid state relay unit or other portion of the earth proving circuit during operation of the electrically powered apparatus.

6. An earth proving circuit whereby the existence of a desired earth connection for electrically powered apparatus can be established and positively indicated prior to the supply of power level voltage and current from a power supply connectable to the electrically-powered apparatus, the circuit comprising a non-inductive solid state relay unit having no inductive reactance and capable of allowing passage of only a low current of the order of a few milliamperes therethrough at a low voltage of the order of 12 volts under conditions where an earth connection for the non-inductive solid state relay unit is established, circuit means for supplying a low current/low voltage electric signal to said non-inductive solid state relay unit and capable of operating said solid state relay unit in the presence of a good ground connection, indicator means for indicating the condition of the earth connection of the non-inductive solid state relay unit in response to energization by said low current/low voltage electric signal, ground connection means for connecting the earth connection of said non-inductive solid state relay unit to electrically powered apparatus to be tested for the existence of a good ground connection in advance of the supply of power level voltage and current thereto, first logic circuit means responsive to the output from said solid state relay unit for locking-out operation of said electrically powered apparatus by preventing the supply of power level current and voltage thereto unless and until the existence of a suitable ground connection to the apparatus is established, second logic circuit means for automatically disconnecting the supply of power level voltage and current to the electrically powered apparatus in the event a ground fault occurs during the operation of the electrically powered apparatus, and wherein said indicator means includes a first indicator for indicating that the earth connection to said electrically powered apparatus is good and a second indicator for indicating that the earth connection to the electrically powered apparatus is bad and in the event of a ground fault during operation of the electrically powered apparatus said second logic circuit means automatically turns off said first indicator and turns on said second indicator, third logic circuit means for automatically disconnecting the supply of power level voltage and current to the electrically powered apparatus in the event a fault occurs in the solid state relay unit or other portion of the earth proving circuit during operation of the apparatus, and wherein said indicator means includes a circuit fault indicator for indicating the occurrence of a fault in the solid state relay unit or other portion of the earth proving circuit and said third logic circuit means automatically turns on said circuit fault indictor in the event a fault occurs in the solid state relay unit or other portion of the earth proving circuit during operation of the electrically powered apparatus, and fourth logic circuit means for locking-out operation of said electrically powered apparatus by preventing the supply of power level current and voltage thereto in the event of a ground or circuit fault during operation of the apparatus and continued operation of a manually operable start switch means, and manually operable reset switch means for resetting said fourth logic circuit means to allow supply of power level current and voltage to the apparatus operable only after correction of the fault and re-establishment and proof of the existence of a suitable ground connection for the electrically powered apparatus.

7. An earth proving circuit according to claim 6 wherein all of said first through fourth logic circuit means are comprised by solenoid actuated relay switches having the fixed and movable switching contacts thereof appropriately interconnected to provide the functions performed by the respective logic circuit means, and wherein the solid state relay unit comprises a solid state photoelectric relay unit having a solid state light emitting element responsive to the low voltage/low current ground proving signal obtained in the presence of a good ground connection and a solid state light activated element responsive to light emitted by said solid state light-emitting element for supplying enabling signals to said first logic circuit means.

* * * * *